(12) United States Patent
Baretich et al.

(10) Patent No.: US 11,043,926 B2
(45) Date of Patent: Jun. 22, 2021

(54) AUDIO POWER SOURCE WITH IMPROVED EFFICIENCY

(71) Applicant: Biamp Systems, LLC, Beaverton, OR (US)

(72) Inventors: David F. Baretich, Wilsonville, OR (US); Simon J. Broadley, West Linn, OR (US)

(73) Assignee: Biamp Systems, LLC, Beaveton, OR (US)

( * ) Notice: Subject to any disclaimer, the term of this patent is extended or adjusted under 35 U.S.C. 154(b) by 0 days.

(21) Appl. No.: 16/726,754

(22) Filed: Dec. 24, 2019

(65) Prior Publication Data

US 2020/0136574 A1 Apr. 30, 2020

Related U.S. Application Data

(63) Continuation of application No. 16/163,103, filed on Oct. 17, 2018, now Pat. No. 10,516,373, which is a continuation-in-part of application No. 15/866,367, filed on Jan. 9, 2018, now Pat. No. 10,608,607.

(51) Int. Cl.
| | | |
|---|---|---|
| *H03F 3/21* | (2006.01) | |
| *H02M 3/15* | (2006.01) | |
| *H03F 3/217* | (2006.01) | |
| *H03F 1/02* | (2006.01) | |
| *H02M 3/158* | (2006.01) | |
| *H02M 3/156* | (2006.01) | |

(52) U.S. Cl.
CPC ........ *H03F 3/2171* (2013.01); *H02M 3/1582* (2013.01); *H03F 1/0227* (2013.01); *H02M 2003/1566* (2013.01); *H03F 2200/03* (2013.01); *H03F 2200/351* (2013.01)

(58) Field of Classification Search
CPC .............................. H03F 3/2171; H02M 3/15
See application file for complete search history.

(56) References Cited

U.S. PATENT DOCUMENTS

| | | |
|---|---|---|
| 5,305,192 A | 4/1994 | Bonte et al. |
| 5,479,090 A | 12/1995 | Schultz |
| 5,636,106 A | 6/1997 | Batarseh et al. |
| 5,691,629 A | 11/1997 | Belnap |
| 5,714,863 A | 2/1998 | Hwang et al. |
| 5,991,171 A | 11/1999 | Cheng |
| 6,172,885 B1 | 1/2001 | Feldtkeller |

(Continued)

FOREIGN PATENT DOCUMENTS

| | | |
|---|---|---|
| EP | 2911282 A1 | 8/2015 |
| WO | 2007082388 A1 | 7/2007 |
| WO | 2016136379 A1 | 9/2016 |

*Primary Examiner* — Patricia T Nguyen

(57) ABSTRACT

Example embodiments provide a device that includes a power transformer with a first output voltage terminal providing a first voltage and a second output voltage terminal providing a second voltage, a voltage regulator coupled to one or more of the first output voltage terminal and the second output voltage terminal, and a power storage element that stores power supplied by the second output voltage, and the first output voltage terminal supplies power to a remote entity until a load power requirement of the remote entity exceeds a threshold power level at which time the power storage element is used to provide power from the second output voltage terminal to the remote entity.

20 Claims, 3 Drawing Sheets

(56) References Cited

U.S. PATENT DOCUMENTS

| | | | |
|---|---|---|---|
| 6,275,018 B1 | 8/2001 | Telefus et al. | |
| 6,707,271 B2 | 3/2004 | Kitagawa | |
| 6,798,177 B1 | 9/2004 | Liu et al. | |
| 7,188,591 B2 | 3/2007 | Long | |
| 7,468,896 B2 * | 12/2008 | Gong | H02M 3/33507 363/21.17 |
| 7,778,049 B2 * | 8/2010 | Morota | H02M 3/33507 363/21.12 |
| 8,577,061 B2 | 11/2013 | French et al. | |
| 8,710,817 B2 * | 4/2014 | Balakrishnan | H02M 3/33523 323/284 |
| 9,166,538 B2 | 10/2015 | Hong et al. | |
| 9,575,527 B2 | 2/2017 | Stickel et al. | |
| 9,936,552 B1 * | 4/2018 | Lau | H05B 45/10 |
| 10,158,282 B1 * | 12/2018 | Maruyama | H02M 1/4225 |
| 10,224,812 B1 | 3/2019 | Sen et al. | |
| 2002/0171475 A1 | 11/2002 | Picha et al. | |
| 2005/0094422 A1 | 5/2005 | Hoffmann et al. | |
| 2006/0022650 A1 | 2/2006 | Vinciarelli | |
| 2006/0261788 A1 | 11/2006 | May | |
| 2007/0194759 A1 | 8/2007 | Shimizu et al. | |
| 2008/0304294 A1 | 12/2008 | Hsiao | |
| 2009/0096531 A1 | 4/2009 | Shimamoto et al. | |
| 2009/0110214 A1 | 4/2009 | Litovsky et al. | |
| 2009/0206657 A1 | 8/2009 | Vuk et al. | |
| 2009/0289709 A1 | 11/2009 | Khoury et al. | |
| 2010/0046251 A1 | 2/2010 | Kyono | |
| 2010/0244788 A1 | 9/2010 | Chen | |
| 2011/0273912 A1 | 11/2011 | Kim et al. | |
| 2012/0262961 A1 | 10/2012 | Chien et al. | |
| 2013/0049469 A1 | 2/2013 | Huff et al. | |
| 2013/0064566 A1 * | 3/2013 | Kojima | H02M 3/33523 399/88 |
| 2014/0361837 A1 | 12/2014 | Strange et al. | |
| 2015/0349737 A1 | 12/2015 | Svendsen | |
| 2016/0248381 A1 | 8/2016 | Yang | |
| 2016/0254746 A1 | 9/2016 | Lerdworatawee | |
| 2017/0237302 A1 | 8/2017 | Sorge | |
| 2018/0006619 A1 * | 1/2018 | Adabi | H03F 3/19 |
| 2018/0138735 A1 | 5/2018 | Maalouf et al. | |
| 2020/0259352 A1 | 8/2020 | Jason et al. | |

* cited by examiner

AUDIO POWER SOURCE WITH IMPROVED EFFICIENCY

BACKGROUND OF THE INVENTION

The subject matter of this application relates to the problem in the audio field that average audio amplifier output power is a fraction of peak output power for typical program material such as speech or music. Known solutions to this problem suffer from significant limitations. For example, in one known system, all power passes through two converters to the load, reducing system efficiency during times when the output load is lower than the source power limit, and reducing the average power available from a limited source.

A second limitation is that all of these circuits involve a higher voltage storage voltage. While that often is advantageous, sometimes storage is more optimally done at lower voltages, such as is the case with batteries, electric double layer capacitors, and other similar storage devices.

SUMMARY OF THE INVENTION

The present application relates to a method of powering electrical equipment such as an audio amplifiers and DC-DC converters. This application claims an improved method of providing high burst power to audio amplifiers from limited power sources. The method employs parallel power paths to increase system efficiency without need for a power path controller, thus utilizing a simplified circuit operation and maximizing average power available for both the amplifier and supporting circuitry.

One example embodiment may include a device that includes a power transformer with a first output voltage terminal providing a first voltage and a second output voltage terminal providing a second voltage, a voltage regulator coupled to one or more of the first output voltage terminal and the second output voltage terminal, and a power storage element configured to store power supplied by the second output voltage, wherein the first output voltage terminal is configured to supply power to a remote entity until a load power requirement of the remote entity exceeds a threshold power level at which time the power storage element is used to provide power from the second output voltage terminal to the remote entity.

The value of V2 may be one of a higher voltage, a lower voltage and the same voltage as the V1 voltage. The set point of the voltage regulator is set to a voltage level that is less than the V1 voltage. The voltage regulator is coupled to the second output voltage terminal. The power storage element is directly coupled to the second output voltage terminal. When the load power requirement of the remote entity exceeds the threshold power level, the V1 voltage decreases below the set point of the voltage regulator. The device may also include an error amplifier and opto-coupler coupled to the first output voltage terminal, and a controller coupled to the error amplifier and opto-coupler, and the error amplifier, opto-coupler and controller include a feedback circuit which provides a feedback signal to the controller to regulate a V1 voltage level.

Another example embodiment may include a device that includes a differential amplifier, a voltage weighting element, coupled to a voltage source which provides an input voltage, to provide a reference voltage with a constant power limit when the input voltage varies, an error amplifier configured to receive and compare the reference voltage provided from the voltage weighting element and a feedback sensed voltage provided from the differential amplifier to identify whether the sensed voltage exceeds the reference voltage, and a pulse width modulation (PWM) controller, coupled to a power transformer and the error amplifier, that reduces a transformer input current provided to the power transformer based on the comparison of the reference voltage from the voltage weighting element and the feedback sensed voltage from the differential amplifier.

The voltage weighting element provides the reference voltage based on a voltage decrease to a current limit set point as the input voltage increases. The differential amplifier includes a low pass filter. The feedback sensed voltage from the differential amplifier is provided from a current sense resistor coupled to the power transformer and the differential amplifier. The power transformer input current is detected by a metal-oxide semiconductor field-effect transistor (MOSFET) transistor switch, the pulse width modulation (PWM) controller reduces a transformer current provided to the power transformer when the feedback sensed voltage from the differential amplifier exceeds the reference voltage from the voltage weighting element.

BRIEF DESCRIPTION OF THE DRAWINGS

For a better understanding of the invention, and to show how the same may be carried into effect, reference will now be made, by way of example, to the accompanying drawings, wherein.

DETAILED DESCRIPTION

Figure 1:
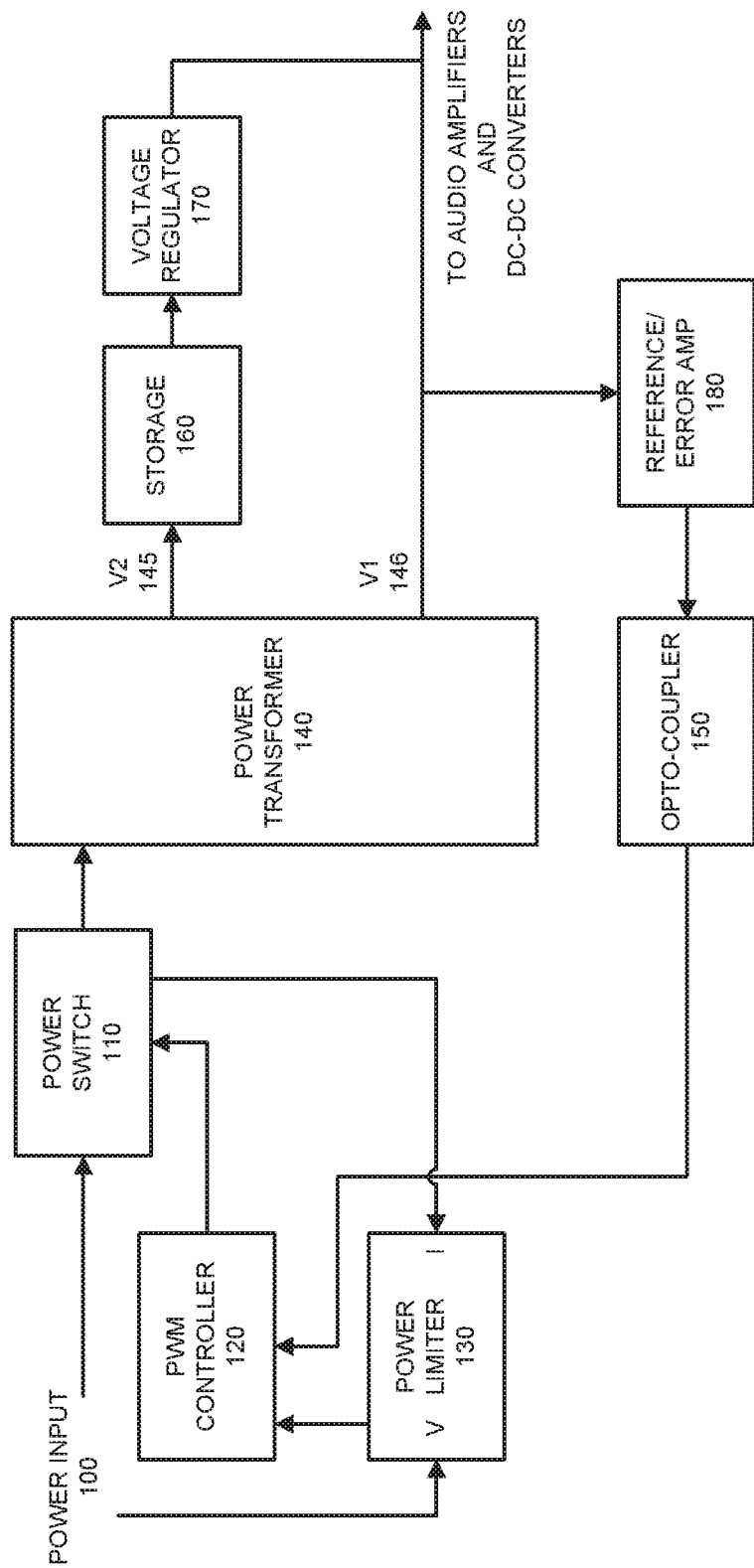
FIG. 1 shows a block diagram of an embodiment of the invention.

This application teaches an improved method of providing high burst power to audio amplifiers from limited power sources. An audio amplifier incorporated in a power supply network is often connected to via a capacitive element to a voltage converter which is itself connected to a storage battery and to an alternator and which is voltage-regulated and current-limited.

It is well known in the audio field that average audio amplifier output power is a fraction of peak output power for typical program material such as speech or music. Operating the audio amplifier gives rise to current being drawn from the network at the outlet of the voltage converter, with this effect being transferred to the inlet of the voltage converter. This may cause current peaks with characteristics which are incompatible with the quality of the amplifier sound.

There are a variety of known methods to attempt to get high peak output from a limited power source or limited power converter. These known solutions to this problem suffer from significant limitations. For example, in one known system, all power passes through two converters to the load, reducing system efficiency during times when the output load is lower than the source power limit, and reducing the average power available from a limited source.

Another limitation of these known methods is that these known circuits involve a higher voltage storage voltage. While that often is advantageous, sometimes storage is more optimally done at lower voltages, such as is the case with batteries, electric double layer capacitors, and other similar storage devices.

The solution of this disclosure employs parallel power paths to increase system efficiency without need for a power path controller, thus utilizing a simplified circuit operation and maximizing average power available for both the amplifier and supporting circuitry.

Power input 100 to the system may come from a variety of sources, where the source itself is limited, or where it is desirable to only draw limited power from a larger source. Examples of limited sources are Power over Ethernet (PoE), USB, AC inverters and AC-DC converters, and batteries with significant impedances where excessive current draw will prematurely trip low battery shutdown circuitry.

Input power is fed through a controlled power switch 110 into a transformer 140. The transformer 140 may be either isolated or non-isolated. There are two outputs from the transformer 140, VI and V2, 145 and 146 respectively.

V1 is the main output which supplies power to the load. This load can include audio amplifiers, DC-DC converters, and digital and analog electronics. V1 is regulated to a constant voltage by use of a reference and error amplifier 180, opto-coupler 150, and pulse-width modulation (PWM) controller 230 to encode the amplitude of a signal right into a pulse width or duration of another signal, usually a carrier signal, for transmission.

A power limiter circuit 130 monitors input power to the transformer 140 and feeds into the PWM controller 120 to limit input power to at or below a predetermined maximum level.

V2 is the storage output, and is fed to a storage bank 160. The storage bank 160 may be a capacitor, electric double layer capacitor, or battery, as will be understood by those skilled in the art.

V2 will be set at a lower voltage than VI, or a higher voltage than VI, or the same voltage as V 1. The choice is made based upon the particular storage technology and storage voltage desired.

V2 is fed into a voltage regulator 170, which is then fed into the output voltage VI. The set point of V2 is slightly lower than V1, so that during normal operation, V1 supplies the load. During this time, the voltage regulator 170 is active but not supplying load current.

In an alternate embodiment, a single control circuit may be used to control both V1 and the voltage regulator output, as will be seen by one skilled in the art. In this way, a constant output voltage will be maintained. VI will supply the load first, and followed by the voltage regulator 170 if V1 is insufficient in power capability.

As will be known by those skilled in the art, the voltage regulator 170 type will vary, depending upon the relationship of V2 to V 1. If V2 is greater than V1, the regulator 170 may be preferably a step-down (buck) converter, a linear regulator, or a buck-boost converter such as SEPIC, flyback, Zeta, or other similar topology.

If V2 is set to less than or equal to VI, a step-up (boost, SEPIC, flyback, Zeta) converter or charge pump may be employed to raise the output voltage as required. If V2 is equal to V1, a step-up (boost, SEPIC, flyback, Zeta) converter or charge pump may be employed to regulate the output voltage as required.

As will be known by those skilled in the art, while the embodiment of FIG. 1 is shown as a single VI and V2 system, the system and method may have multiple embodiments of the same concept, to allow for different types of loads, and for alternatively bipolar (plus and minus output) supplies as are commonly used in audio amplifiers.

In operation, when supplying a load where input power is below the limit set point, all load power is provided through VI. This is a distinction of the invention over prior art, where load power passes through a storage bank and an output regulator.

Because of this feature, overall converter efficiency is enhanced. That is, because V1 and V2 are parallel paths rather than in series, the more efficient path is used when possible, which is V1 as shown in FIG. 1.

This is especially advantageous for limited sources, as it maximizes the average power available to the load. Additionally, during the time where input power is below the limit set point, power not used by the load (through V1) is used to charge the storage bank 160 via V2. Total input power never exceeds the desired limit. When the storage bank 160 is fully charged, V2 current drops to zero and V1 continues to supply the load.

Burst operation occurs when required output power exceeds that which can be supplied by V1. V1 power limit is the input power set point multiplied by converter efficiency.

During burst operation, as output power exceeds what V1 can provide, V1 voltage begins to decrease. When it decreases to the V2 voltage regulator set point, the regulator 170 takes over and provides output power. V1 stops supplying current and all available converter power transfers to V2. V2 voltage regulator power is therefore supplied for short periods by energy in the storage bank 160 in combination with the converter via V2. This minimizes the amount of storage required.

Once burst power is no longer required, the system begins to return to its normal state. The voltage regulator 170 continues to supply load power while V2 charges the storage bank 160. As the storage bank 160 charges, V1 increases in value. When V1 increases to the set point of the V2 voltage regulator, the voltage regulator 170 output current reduces. V1 again supplies power to the load and returns to its regulated set point.

Advantages of the invention are increased efficiency, maximized output power from a limited source, reduced power dissipation, and reduced energy usage.

For power limited applications such as PoE (Power over Ethernet), the power limiter 130 preferably engages quickly to void tripping the PSE (Power Sourcing Equipment) (not shown) current limit. Accordingly, its bandwidth must be high and latency low. Simply measuring DC input current and voltage are insufficient, because input LC filters typical to PoE applications slow the current sense time. This in turn limits the maximum bandwidth of the current loop and affects the stability of the power limit circuit. When burst operation is required, the input current can overshoot before the power limiter 130 can engage, risking exceeding PSE current limit and causing system shut-down.

Figure 2:
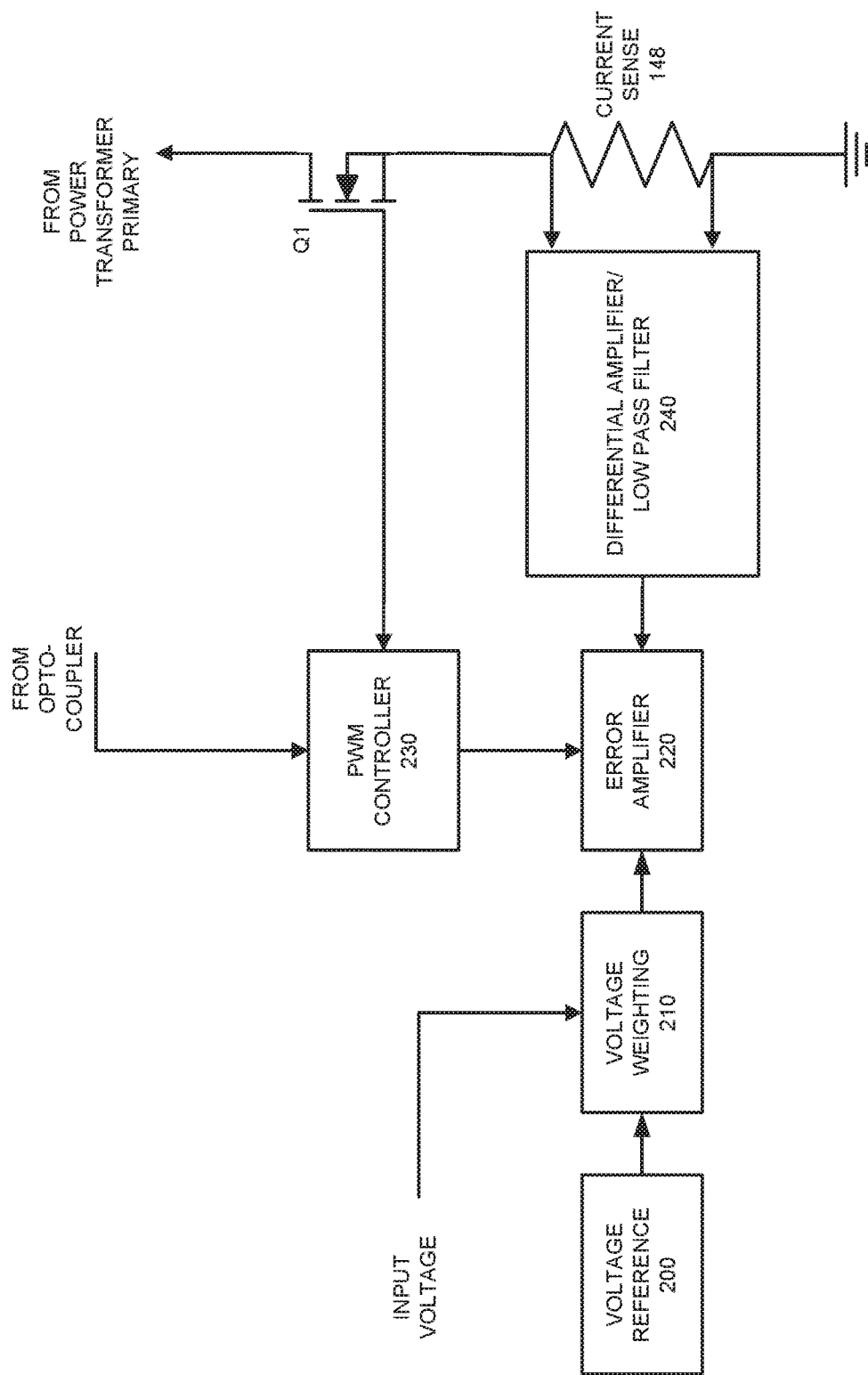
FIG. 2 shows a block diagram of an embodiment of the power limiter block.

The power limiter block diagram is shown in FIG. 2. This embodiment is applicable for single ended converters. However, adaptations for other topologies such as half bridge, full bridge, resonant, and can be implemented, as will be understood by those skilled in the art.

A voltage reference 200 provides an initial set point for primary current limit. Next, a voltage weighting block 210 takes the reference voltage and adjusts it based on the input voltage to achieve a constant power limit. That is, increased input voltage decreases reference output, which in turn decreases the current limit set point. The weighted reference is fed into the error amplifier 220.

Current from the power transformer 140 is switched by switch 147 and sensed in a current sense resistor 148. It may alternately be sensed by a current transformer or other current sense method (not shown).

This current sense signal 148 is fed into a differential amplifier 240, which is implemented with a low pass filter to create an average current signal from the instantaneous current in the current sense resistor.

This is a critical step to fast power limit response in that the instantaneous input current is very quickly controlled by the PWM controller 230. Current response delay is low with this method and is not affected by the input filter. As a result, the low pass filter of the differential amplifier 240 may be implemented at a frequency of choice to optimize response time and stability.

Output from the differential amplifier 240 is fed into the error amplifier 220 and compared to the weighted reference. If average sensed current exceeds the reference, the error amplifier 220 outputs a signal to the PWM controller 230 to reduce transformer current to maintain power at the limit set point.

Stability compensation of the current loop is implemented with the low pass filter in the differential amplifier 240, and with error amplifier 220 compensation.

DC current sensing circuits (that is, anywhere in the input current path before the converter stage itself) are limited by the cutoff frequency of the input filter. In known systems, this can be as low as a few kHz to create an economical filter sufficient for EMC compatibility, and in these known systems, faster response requires a higher frequency cut-off, reducing filtering effectiveness.

Advantageously, the system and method taught herein avoids limitation, since the bandwidth of the current loop is not dependent upon the input filter. Here, bandwidths of 30 kHz or higher are easily implemented. The input filter may therefore be designed independently of the current loop for the most effective filtering at lowest cost.

The standard IEEE 802.3(at) for PoE+ currently specifies a maximum load of 25.5 W for a powered device. In known systems, this generally means 25.5 W input with 90% converter efficiency makes 22.95 W available for loads. Digital and communications circuitry can easily draw 3 W in a typical application, leaving approximately 20 W available to the power amplifier. A typical Class D audio amplifier will have an efficiency of 80%, meaning actual audio is 20 W×80%=16 W continuous output. Since PoE+ power sources have limited power, along with fast acting current limits, any peak power output above 16 W risks an overcurrent of the power source, shutting down operation. Limiters on the amplifier can prevent this, but audio quality suffers due to the limitation. This severely limits the practicality of prior art implementations, especially in a larger conference room.

In contrast, one embodiment of this disclosure utilizes an audio power amplifier that operates from a limited Power over Ethernet source. In this embodiment, internal storage provides for higher peaks while the converter limits power input, making it is possible to have peak audio output utilizing power greater than 16 W.

In this embodiment, power input ranging from 42.5 VDC to 57 VDC from an Ethernet power source is received by a RJ-45 connector and passes through an Ethernet coupling transformer to provide DC outputs. The output polarity varies, so it is passed through a pair of bridge rectifiers to provide a DC output of known polarity. Circuit topology for this embodiment is a single ended flyback converter, which provides isolation and good tracking of multiple output voltages.

The power switch employed is an N-channel MOSFET with 150 VDC rating to handle input voltage, transformer flyback voltage, and provide margin for reliability. A preferred operating frequency is 250 kHz, which offers reasonable size, cost, and efficiency. The power switch is controlled by PWM controller, which operates in peak current mode control with an overall loop response of approximately 2 kHz for the main converter loop. The power switch source current is sensed with resistor and fed into the PWM controller to detect peak primary current.

In this embodiment, converter outputs are 25.5V and 51V, although this can be adjusted as necessary to optimize audio performance. The 25.5V output provides power directly to an audio amplifier, as well as digital and communications circuitry via post regulators. The 51V output supplies the storage, which is implemented here by 5×680 uF aluminum electrolytic capacitors. The control loop is closed around the 25.5V output. Voltage tolerance is set tight, using a 0.5% reference and 0.1% divider resistors. The set point is 25.5 VDC, which allows for highest audio output while not exceeding amplifier input voltage rating of 26 VDC.

Error feedback is transmitted to the controller by a linear optocoupler. The controller can employ either optocoupler feedback or primary side regulation, and an optocoupler is used here for maximum output precision and best dynamic load response.

Input power limiter in operation utilizes the equation Input Power=Input Voltage×Input Current. Primary current is sensed with a resistor, however the power limiter uses average converter current instead of peak current. Using peak primary current for power limiting would result in large inaccuracies due to varying duty cycle with input voltage, as well as transformer magnetizing current. Average input current is a more precise method to achieve an accurate power limit.

To determine average input current, resistor voltage is fed into a precision high speed differential amplifier with excellent common mode rejection ratio specifications. The differential feedback network includes frequency compensation to average the input current signal, and provide for a fast, but stable power loop. Here, power limiter loop response is approximately 30 kHz, and input current peaks that could cause the power source to current limit and shut the amplifier down are greatly reduced and shortened.

Alternatively, average current sensing could be accomplished by sensing average return current or input filter inductor, however this causes a slower response. The filter inductor and capacitors, in combination, introduce a double pole in the loop response at approximately 4.3 kHz in this embodiment, which is less optimal speed to achieve a quick power limit with little or no input current overshoot.

Input of the high-speed differential amplifier is fed into a further error amplifier, and compared against a reference provided by voltage reference shunt. The reference is weighted by the input voltage such that increased voltage in results in a lower reference output. Output weighting reduces input current at higher input voltages, in keeping with a constant power input. With proper component selection, input power can be made accurate to within +/−2% over the input voltage range. Available input power usage is maximized without exceeding power source limits.

Output from error amplifier is fed through Q9 into the feedback pin of PWM controller, completing the power loop.

On the output side of the converter, 51V is fed to a bank of storage capacitors. The 51V output is further fed to a buck regulator.

The buck regulator output is set for 25.0 VDC. In this example, this voltage is below the main loop set point of 25.5 VDC, the buck regulator is off during normal operation, and load power is provided by the 25.5V flyback output.

When amplifier output requires power above the power limit of the flyback converter, dynamic, or "burst", operation ensues. The first result is that, under power limit, the 25.5V output begins to fall from its 25.5 VDC set point. When it drops to 25.0V, the buck regulator controller engages to maintain voltage at a 25.0 V level. Buck regulator loop response is set to 10 kHz or higher so that it can quickly respond.

Power is drawn from storage during burst operation, and storage voltage gradually drops during this time. At the same time, the converter sources as much power as possible to the 51V output to minimize voltage drop. Input power stays constant at the limit during burst operation, maximizing audio power and reducing storage requirements.

Buck regulator is chosen to maximize duty cycle operation and minimizes voltage dropout through the buck regulator, further maximizing audio output capability and reducing storage requirements.

Once dynamic amplifier power reduces to below the power limit, the flyback remains at full power until the 51V storage output is recharged to normal levels and the 25.5V output rises above 25.0 VDC. At this point, the buck regulator turns off and normal operation is restored.

As designed and described, transition in and out of burst operation is smooth and requires no separate power path controller. System cost and design complexity are thus minimized.

Accordingly, the preferred embodiment realizes an increase in dynamic power of greater than an order of magnitude over prior art. Much larger rooms and venues are serviced with the invention. Listening tests confirm a clear superiority in side-by-side comparisons. Stated in terms of dynamic power rating, a full bandwidth amplifier of this embodiment has been measured at 50 W×4 for a four-channel implementation, which offers a total of 200 W of dynamic audio power before the amplifier clips or is required to limit. Accordingly, the preferred embodiment realizes an increase in dynamic power of greater than an order of magnitude over known systems. It will be appreciated that the system is not restricted to the particular embodiment that has been described, and that variations may be made therein without departing from the scope of the system as defined in the appended claims, as interpreted in accordance with principles of prevailing law, including the doctrine of equivalents or any other principle that enlarges the enforceable scope of a claim beyond its literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

According to other example embodiments and referring to FIGS. 1 and 2, V2 can be either higher, lower, or the same voltage as V1. The set point of the voltage regulator 170 may be set slightly below the V1 set point regardless of whether or not V2 is higher, lower, or the same as V1.

Setting the voltage regulator 170 set point below V1 provides that, under most conditions, output power of the power transformer 140 is supplied by V 1. When V1 becomes power limited, due to high load requirements, then V1 drops below the voltage regulator set point, permitting burst power to come from the storage 160 via the voltage regulator 170.

The error amplifier 180 and opto-coupler 150 are part of the V1 feedback circuit, but not part of the power limiting circuit. A feedback signal from the error amplifier 180 is transferred through the opto-coupler 150 back into the PWM controller 120 to regulate V1. The actual power limit is performed by the power limiter 130 sensing input voltage and power switch current. There is a variable voltage reference in the power limiter block 130, as well as another error amplifier 220. When input power exceeds the limit, this other error amplifier 220 is provided to the PWM controller 230 to limit converter power. Error amplifier 220 is implemented with one section of a dual operational amplifier and uses a separate reference voltage 200. The voltage regulator 170 has a [set point voltage] that is set lower than V1, as explained above. The N-channel metal oxide semiconductor field effect transistor (MOSFET) is labelled power switch 100 in FIG. 1 and Q1 in FIG. 2.

In operation, a voltage load may have an input power below the limit set point, in which case, all load power is provided through V1 and the load power to the storage bank may be turned off when load power is below the set point. At power levels below the set point limit, power only passes through a single converter (V1 output) before being used by the load. This provides an efficiency increase, as well as a reduction in power dissipation. During this time, the storage bank 160 is disconnected because voltage regulator 170 is not operating since its output voltage set point is lower than V1. Burst power begins when the load power is greater than what V1 can supply. This load power is equal to the input power limit multiplied by the efficiency of the converter. In the AMP-450P, V1 will deliver about 23 W to loads from a 25.5 W PoE+ input (90% efficiency). The term 'converter' represents the major power components, such as the power switch 110, the transformer 140 and outputs V1 146 and V2 145. The power limiter 130 of FIG. 1 includes the voltage reference 200, the voltage weighting component 210, error amplifier 220, differential amplifier 240 and current sense resistor 148 of FIG. 2.

Power transfer to burst power is inherently smooth and does not require a decision or control input. V1 is set for 25.5V, for example, and voltage regulator 170 is set for 25.0V. As output load increases past the limits of V1, output voltage will start to drop. As V1 drops below 25.0V, voltage regulator 170 will begin to regulate, pulling its energy from the storage bank 160, and maintaining a 25.0V output level. Other voltages may be used and this example is for example purposes only. The converter/transformer 140 continues to supply output power at its limit through V2 during this time. This reduces the amount required from the storage bank, extending its storage capacity. The converter/transformer 140 may be an isolated flyback converter, where V1 and V2 approximately track each other according to their turn ratios on the transformer 140, as will be understood by those skilled in the art. During burst operation, the voltage level on the transformer 140 supplying V1 has dropped to where it cannot supply the output voltage, but power transfers naturally to V2 as they both come from the same transformer 140.

Once output load power reduces again below the set point limit, storage energy is replenished through V2 while output voltage is still maintained at 25.0V by voltage regulator 170. Once storage is sufficiently charged through V2, the voltage on the transformer winding portion of the transformer supplying V1 is high enough that V1 starts sourcing again. As V1 rises above 25.0V, voltage regulator 170 stops supplying current. V1 continues to rise to its set point of 25.5V and returns to regulation.

The effectiveness of this circuit can be demonstrated with an example from a 25.5 W input, the AMP-450P can supply short term bursts of audio power exceeding 200 W (50 W×4 channels). The AMP-450P is not part of the examples in FIGS. 1-3 and represents an end product that utilizes the circuits illustrated in FIGS. 1-3. This enhances the performance capability over a standard PoE amplifier. There are varying levels of power available from the PoE amplifier, so higher power limits will proportionately increase output capability.

One example embodiment may include a device that includes a power transformer with a first output voltage terminal providing a first voltage and a second output voltage terminal providing a second voltage, a voltage regulator coupled to one or more of the first output voltage terminal and the second output voltage terminal, and a power storage element configured to store power supplied by the second output voltage, wherein the first output voltage terminal is configured to supply power to a remote entity until a load power requirement of the remote entity exceeds a threshold power level at which time the power storage element is used to provide power from the second output voltage terminal to the remote entity.

The value of V2 may be one of a higher voltage, a lower voltage and the same voltage as the V1 voltage. The set point of the voltage regulator is set to a voltage level that is less than the V1 voltage. The voltage regulator is coupled to the second output voltage terminal. The power storage element is directly coupled to the second output voltage terminal. When the load power requirement of the remote entity exceeds the threshold power level, the V1 voltage decreases below the set point of the voltage regulator. The device may also include an error amplifier and opto-coupler coupled to the first output voltage terminal, and a controller coupled to the error amplifier and opto-coupler, and the error amplifier, opto-coupler and controller include a feedback circuit which provides a feedback signal to the controller to regulate a V1 voltage level.

Another example embodiment may include a device that includes a differential amplifier, a voltage weighting element, coupled to a voltage source which provides an input voltage, to provide a reference voltage with a constant power limit when the input voltage varies, an error amplifier configured to receive and compare the reference voltage provided from the voltage weighting element and a feedback sensed voltage provided from the differential amplifier to identify whether the sensed voltage exceeds the reference voltage, and a pulse width modulation (PWM) controller, coupled to a power transformer and the error amplifier, that reduces a transformer input current provided to the power transformer based on the comparison of the reference voltage from the voltage weighting element and the feedback sensed voltage from the differential amplifier.

The voltage weighting element provides the reference voltage based on a voltage decrease to a current limit set point as the input voltage increases. The differential amplifier includes a low pass filter. The feedback sensed voltage from the differential amplifier is provided from a current sense resistor coupled to the power transformer and the differential amplifier. The power transformer input current is detected by a metal-oxide semiconductor field-effect transistor (MOSFET) transistor switch, the pulse width modulation (PWM) controller reduces a transformer current provided to the power transformer when the feedback sensed voltage from the differential amplifier exceeds the reference voltage from the voltage weighting element.

Figure 3:
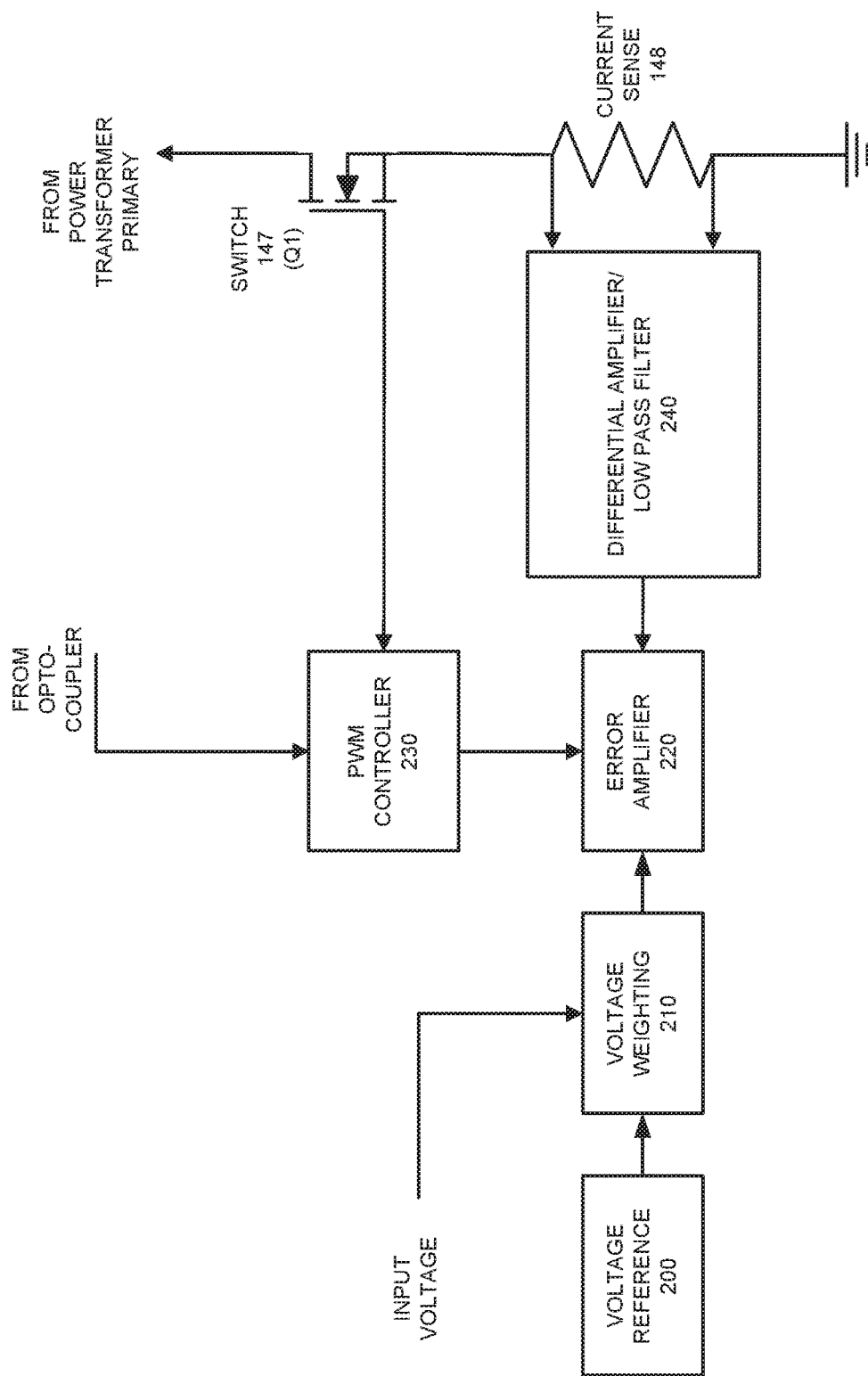
FIG. 3 shows a more detailed configuration of the power limiter block.

FIG. 3 illustrates a more detailed configuration of the power limiter circuit of FIG. 2. Switch 147 Q1 is controlled by the MOSFET transistor.

In another example embodiment, the power limiter 130 of FIG. 1 and the corresponding portions of the power limiter identified in FIG. 2 include a reference output and a reference feedback voltage. There is a divider to the input voltage (VIN) which adjusts the reference output down as the VIN increases. The reference output becomes a variable current limit reference such that increased VIN creates a lower reference to keep the total power the same. This provides a straight-line approximation of power set for 25.5 W at VIN=42.5V and VIN=57V. In between, the power slightly increases to around 26 W, which is within an expected design tolerance range. This example is one example and other voltages may be used to those skilled in the art.

What is claimed is:

1. A device, comprising:
a controller;
a power transformer comprising a first output voltage terminal providing a first voltage (V1) and a second output voltage terminal providing a second voltage (V2) and wherein the controller is used to control the amount of voltage of one or more of V1 and V2 based on a feedback signal; and
a power storage element configured to store power supplied by the second output voltage, wherein the first output voltage terminal is configured to supply power to a remote entity until a load power requirement of the remote entity exceeds a threshold power level at which time the power storage element is used to provide power from the second output voltage terminal to the remote entity.

2. The device of claim 1, wherein V2 is one of a higher voltage, a lower voltage and the same voltage as the V1 voltage.

3. The device of claim 1, comprising a voltage regulator coupled to the first output voltage terminal.

4. The device of claim 3, wherein the voltage regulator is coupled to the second output voltage terminal.

5. The device of claim 3, wherein a set point of the voltage regulator is set to a voltage level that is less than the V1 voltage.

6. The device of claim 1, wherein the power storage element is directly coupled to the second output voltage terminal.

7. The device of claim 1, wherein when the load power requirement of the remote entity exceeds the threshold power level, the V1 voltage decreases below a set point of the voltage regulator.

8. The device of claim 1, further comprising an error amplifier and opto-coupler coupled to the first output voltage terminal.

9. The device of claim 8, wherein the controller is coupled to the error amplifier and opto-coupler.

10. The device of claim 9, wherein the error amplifier, opto-coupler and the controller comprise a feedback circuit which provides the feedback signal to the controller to regulate a V1 voltage level.

11. A device, comprising:
a first module comprising a first output voltage terminal providing a first voltage (V1) and a second output voltage terminal providing a second voltage (V2) and wherein a controller is used to control the amount of voltage of one or more of V1 and V2 based on a feedback signal; and a second module configured to store power supplied by the second output voltage, wherein the first output voltage terminal is configured to supply power to a remote entity until a load power requirement of the remote entity exceeds a threshold power level at which time the second module is used to provide power from the second output voltage terminal to the remote entity.

12. The device of claim 1, wherein V2 is one of a higher voltage, a lower voltage and the same voltage as the V1 voltage.

13. The device of claim 1, comprising a voltage regulator coupled to the first output voltage terminal.

14. The device of claim 3, wherein the voltage regulator is coupled to the second output voltage terminal.

15. The device of claim 3, wherein a set point of the voltage regulator is set to a voltage level that is less than the V1 voltage.

16. The device of claim 1, wherein the second module is directly coupled to the second output voltage terminal.

17. The device of claim 1, wherein when the load power requirement of the remote entity exceeds the threshold power level, the V1 voltage decreases below a set point of the voltage regulator.

18. The device of claim 1, further comprising an error amplifier and opto-coupler coupled to the first output voltage terminal.

19. The device of claim 8, wherein the controller is coupled to the error amplifier and opto-coupler.

20. The device of claim 9, wherein the error amplifier, opto-coupler and the controller comprise a feedback circuit which provides the feedback signal to the controller to regulate a V1 voltage level.

* * * * *